(12) United States Patent
Takayama et al.

(10) Patent No.: US 6,991,997 B2
(45) Date of Patent: Jan. 31, 2006

(54) SEMICONDUCTOR FILM, SEMICONDUCTOR DEVICE AND METHOD FOR MANUFACTURING SAME

(75) Inventors: Toru Takayama, Kanagawa (JP); Kengo Akimoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/157,843

(22) Filed: May 31, 2002

(65) Prior Publication Data

US 2002/0182783 A1  Dec. 5, 2002

(30) Foreign Application Priority Data

Jun. 1, 2001  (JP) ............................ 2001-167481
Jul. 30, 2001 (JP) ............................ 2001-230469

(51) Int. Cl.
  *H01L 21/322* (2006.01)
  *H01L 21/20* (2006.01)

(52) U.S. Cl. ................... 438/471; 438/482; 438/486

(58) Field of Classification Search ............. 433/482, 433/486, 479, 485, 471, 476, 478
See application file for complete search history.

(56) References Cited

U.S. PATENT DOCUMENTS

| | | | |
|---|---|---|---|
| 5,248,630 A | 9/1993 | Serikawa et al. | |
| 5,643,826 A | 7/1997 | Ohtani et al. | |
| 5,736,438 A | * 4/1998 | Nishimura et al. | 438/166 |
| 5,789,284 A | 8/1998 | Yamazaki et al. | 433/166 |
| 5,923,962 A | 7/1999 | Ohtani et al. | |
| 6,013,544 A | 1/2000 | Makita et al. | |
| 6,048,758 A | 4/2000 | Yamazaki et al. | |
| 6,071,766 A | 6/2000 | Yamazaki et al. | 438/166 |
| 6,285,042 B1 | 9/2001 | Ohtani et al. | |
| 6,335,541 B1 | 1/2002 | Ohtani et al. | |
| 6,429,097 B1 | * 8/2002 | Voutsas et al. | 438/478 |
| 6,686,262 B2 | * 2/2004 | Yamazaki et al. | 438/486 |
| 2002/0098628 A1 | 7/2002 | Hamada et al. | |
| 2002/0102764 A1 | 8/2002 | Yamazaki et al. | |
| 2002/0125480 A1 | 9/2002 | Nakamura et al. | |
| 2002/0134981 A1 | 9/2002 | Nakamura et al. | |
| 2002/0151120 A1 | 10/2002 | Yamazaki et al. | |
| 2002/0155652 A1 | 10/2002 | Yamazaki et al. | |
| 2002/0182785 A1 | 12/2002 | Miyairj | |
| 2002/0197785 A1 | 12/2002 | Yamazaki et al. | |

FOREIGN PATENT DOCUMENTS

| | | |
|---|---|---|
| EP | 0 651 431 A2 | 5/1995 |
| JP | 05-109737 | 4/1993 |

(Continued)

OTHER PUBLICATIONS

U.S. Appl. No. 10/190,755: Filed Jul. 9, 2002 "Semiconductor Film. Semiconductor Device and Method for Manufacturing Same" (Filing Receipt. Specification. Claims and Drawings).

(Continued)

*Primary Examiner*—T. N. Quach
(74) *Attorney, Agent, or Firm*—Nixon Peabody LLP; Jeffrey L. Costellia (57) ABSTRACT

Concerning an art related to a manufacturing method for a semiconductor device having an integrated circuit using thin film transistors on a substrate, a problem is to provide a condition for forming an amorphous silicon film having distortion. In the deposition of an amorphous silicon film using a sputter method, a condition is provided with a frequency of 15 to 25 kHz and a deposition power of 0.5 to 3 kW. This can sufficiently contain Ar at $10 \times 10^{20}/cm^3$ or more in an amorphous silicon film, thus making possible to form an amorphous silicon film having distortion.

15 Claims, 8 Drawing Sheets

FOREIGN PATENT DOCUMENTS

| | | |
|---|---|---|
| JP | 07-183540 A | 7/1995 |
| JP | 08-078329 A | 3/1996 |
| JP | 09-134882 | 5/1997 |

OTHER PUBLICATIONS

U.S. Appl. No. 10/155,986: Filed May 29,2002 "Semiconductor Film. Semiconductor Device and Method of Their Production" (Filing Receipt. Specification. Claims and Drawings).

Sugiyama, "Strained Silicon Crystal on SiGe Substrate", pp. 1315-1319, Nov. 2000, Applied Physics, vol. 69 [11], and English Translation.

* cited by examiner

SEMICONDUCTOR FILM, SEMICONDUCTOR DEVICE AND METHOD FOR MANUFACTURING SAME

BACKGROUND OF THE INVENTION

Field of the Invention

The present invention relates to a method of manufacturing a semiconductor film having an amorphous structure by a sputtering technique, a semiconductor device, which includes a circuit structured by a thin film transistor (hereinafter referred to as TFT) using the semiconductor film, and a method of the semiconductor device. More particularly, the present invention is related to an electro-optic device typified by a liquid crystal display device and an electronic equipment that is installed such electro-optic device as parts of it.

In this specification, the semiconductor device indicates the entire devices, which functions by utilizing a semiconductor characteristics. The electro-optic device, the semiconductor circuit and the electric equipment are all semiconductor devices.

A thin film transistor (hereinafter referred to as a TFT) is known as a typical semiconductor element using a semiconductor film having a crystalline structure. The TFT is noted as a technique for forming an integrated circuit on an insulating substrate made of glass or the like, and a driver circuit integrated liquid crystal display device and the like are putting into practical use. According to a conventional technique, an amorphous semiconductor film deposited by a plasma CVD method or a low pressure CVD method is processed by heat treatment or a laser anneal method (technique for crystallizing a semiconductor film by laser light irradiation) to produce the semiconductor film having a crystal structure.

Since the crystalline semiconductor film thus produced is an aggregate of a large number of crystal grains, and its crystal orientation is oriented in an arbitrary direction which is thus uncontrollable, this causes a reduction in a characteristic of the TFT. To solve such a problem, a technique disclosed in Japanese Patent Application Laid-open No. Hei 7-183540 is one that a semiconductor film is manufactured by adding a metal element for promoting a crystallization of a semiconductor film, such as nickel. By the technique orientation property of the crystal orientation can be improved to be a single direction, in addition to an effect of decreasing a heating temperature required for the crystallization. When a TFT is made from a crystalline semiconductor film produced by this technique, a subthreshold coefficient (S value) is decreased in addition to an improvement of electric field effect mobility. Thereby, it is possible that a static characteristic is improved rapidly.

However, since a metal element for promoting a crystallization is added, there is such a problem that the metal element is left in the inner portion or the surface of the crystalline semiconductor film, and thus a characteristic of an obtained element is varied. One example of the problem is that an off current is increased and a variation between the individual elements is caused. That is, the metal element having catalysis to crystallization conversely becomes unnecessary once the crystalline semiconductor film has been formed.

Gettering using phosphorus is effectively used as a method of removing such a metal element from a specific region of the crystalline semiconductor film. For example, phosphorus is added to a source and a drain regions of a TFT and then heat treatment is performed at 450 to 700° C., whereby the metal element can be easily removed from the channel forming region.

Phosphorus is implanted to the crystalline semiconductor film by an ion dope method (which is a method of dissociating $PH_3$ or the like with plasma and accelerating ions of $PH_3$ by an electric field to implant it into a semiconductor, and a method in which ion mass separation is not basically performed). A concentration of phosphorus required for gettering is $1\times10^{20}/cm^3$ or higher. Addition of phosphorus by the ion dope method causes the crystalline semiconductor film to be amorphous. However, when the concentration of phosphorus is increased, a problem in which recrystallization by later anneal is hindered is caused. In addition, it is problem that the addition of high concentration phosphorus causes an increase in a processing time required for doping, and thereby, throughput in a doping process is decreased.

Further, a concentration of boron required for inverting a conductivity type is 1.5 to 3 times higher than that of phosphorus added to a source region and a drain region of a p-channel TFT. Thus, a problem in which resistances of the source region and the drain region are increased is caused in addition to the above mentioned difficulty of recrystallization.

The present invention is a mean to solve these problems. The present invention have a purpose of offering a technique to remove a metal element left in a semiconductor film efficiently after obtaining the semiconductor film having a crystal structure by using the metal element having catalysis to crystallization.

SUMMARY OF THE INVENTION

The gettering technique is positioned as a major art in the technology for fabricating an integrated circuit using a single-crystal silicon wafer. Gettering is known as an art to aggregate a metal impurity element introduced in a semiconductor into a gettering site by certain energy, thereby reducing an impurity concentration in an active region of the device. This is roughly divided into two, i.e. extrinsic gettering and intrinsic gettering. Extrinsic gettering externally applies a distortion field or chemical action from the outside to provide a gettering effect. This includes the gettering of diffusing high-concentration phosphorus from the back surface of a single-crystal silicon wafer. The foregoing gettering using phosphorus is also to be considered as one of extrinsic gettering.

Meanwhile, intrinsic gettering is known as a utilization of a distortion field of an oxygen-involved lattice defect caused within a single-crystal silicon wafer. The present invention, noticed on such intrinsic gettering utilizing lattice defects or lattice distortion, employs the following means in order for application to a crystallized-structured semiconductor film having a thickness of approximately 10 to 100 nm.

The present invention comprises a step of forming a first crystallized semiconductor film by using a metal element on an insulating surface, a step of forming etching stopper (barrier layer), a step of forming a second semiconductor film (gettering site) containing an inert gas element, a step of gettering the metal element to a gettering site and a step of removing the second semiconductor film.

In the invention, the step of forming a gettering site is the step of forming an amorphous semiconductor film containing an inert gas element with high concentration. typically an amorphous silicon film, by using a sputter method with a semiconductor target and with glow discharge in an atmosphere containing an inert gas element. A semiconductor target (specific resistance value: 0.01 to 1000 Ω·cm) may be used that contains an impurity element (phosphorus, arsenic, boron or the like) to provide one conductivity type to the semiconductor. A target of silicon, silicon-germanium or silicon carbide is used correspondingly to an amorphous-structured semiconductor film to be formed. Of course, in the case of forming a silicon compound, a silicon target and a target of the same element are provided together to conduct concurrent sputtering for formation. Otherwise, reactive sputtering may be made with introducing a reactive gas containing the same element.

As compared to a semiconductor film formed by a DC-schemed sputter apparatus, the semiconductor film formed by an RF-schemed sputter apparatus can contain an inert gas element at a higher concentration of $1 \times 10^{19}$ to $1 \times 10^{22}/cm^3$, preferably $1 \times 10^{19}$ to $1 \times 10^{21}/cm^3$, more preferably $1 \times 10^{20}$ to $6 \times 10^{20}/cm^3$.

The present invention concerning a method for manufacturing a semiconductor film disclosed in the description is a method for manufacturing an amorphous semiconductor film characterized by: forming an amorphous semiconductor film containing an inert gas element at $1 \times 10^{19}/cm^3$ to $1 \times 10^{22}/cm^3$ on a surface by a sputter method that glow discharge is caused by introducing an inert gas in a deposition chamber at a deposition pressure of 0.1 Pa to 5 Pa and applying an alternating current. As the deposition pressure within the deposition chamber is lower, the inert gas element can be contained at higher concentration in the film.

In the above structure, an RF electric power density for causing glow discharge is 0.137 W/cm² to 6.847 W/cm² (where using an electrode having a diameter of 30.5 cm, RF electric power: 0.1 kW to 5 kW). As the RF electric power density is lower, the inert gas element can be contained at higher concentration in the film.

In the above structure, it is preferred to carry out deposition under a deposition pressure of 1.5 Pa or lower within the deposition chamber. In order to excite glow discharge, applied is a high frequency electric power at 1 kHz to 30 MHz. preferably 10 to 20 MHz. The temperature of a substrate may be a room temperature, wherein there is no problem at 30° C. or lower.

The atoms sputtered by the inert gas element gain a kinetic energy to scatter. Part of them is deposited and formed as a coat on the substrate. By lowering the deposition pressure, the probability is decreased of bombardment between the sputtered atoms and the inert gas element in the gas phase so that high-energy atoms arrive at the substrate and deposit thereon. It can be considered that radio-frequency discharge enhances electron energy to increase excited inert gas atoms and ionized inert gas element thereby promoting the interaction at a growth surface of the film. As a result. there is increase in the probability of incorporating the inert gas element into the film. Thus, it is possible to form an amorphous-structured semiconductor film containing the inert gas element at the foregoing concentration.

In the above structure, the inert gas is one or a plurality of kinds selected from the group consisting of He, Ne, Ar, Kr and Xe. Particularly, preferred is an inert gas element having an atomic number having a greater atomic radius than silicon, typically Ar.

The semiconductor film to be obtained by the foregoing manufacturing method is an amorphous semiconductor film characterized by: containing an inert gas element at a concentration of $1 \times 10^{19}/cm^3$ to $1 \times 10^{21}/cm^3$ wherein a film internal stress is a compression stress. Incidentally, as the deposition pressure within the deposition chamber lowers, the internal stress of the film increases, while as the RF electric power density decreases, the internal stress of the film decreases.

Incidentally, by adding an inert gas element at the foregoing concentration to the amorphous semiconductor film, distortion can be provided to the semiconductor film. Because the density of the amorphous silicon film is approximately $5 \times 10^{22}/cm^3$, a distortion field can be formed by adding 0.25 atomic % or more of argon. The inert gas, such as argon, is inserted in a lattice without combining with silicon to cause distortion in the atom position of silicon, causing internal stress. The stress, acting in a direction of mutually repelling the atoms, is a compression stress.

Internal stress, in general, includes tensile stress and compression stress. When the thin film acts to shrink relative to the substrate, the substrate is deformed inward at the thin film to pulling in a direction preventing the thin film for shrinking. This is called a tensile stress. On the other hand, when the thin film acts to expand, the substrate is compressed and deformed outside at the thin film. This is called a compression stress. In the description, compression stress is denoted minus (−) while tensile stress plus (+).

It is possible to provide the amorphous semiconductor film with a high gettering ability, when the amorphous semiconductor film has a distortion thus obtained and is applied as a gettering site. Otherwise, it if utilized as a device active region (active layer) can improve electron and hole mobility.

The invention concerning a method for manufacturing a semiconductor device. disclosed in the description, comprises:

a first step of forming a first amorphous semiconductor film over an insulating surface;

a second step of adding a metal element to the first semiconductor film having an amorphous structure;

a third step of crystallizing the first amorphous semiconductor film to form a first crystallized semiconductor film;

a fourth step of forming a barrier layer on a surface of the first crystallized semiconductor film;

a fifth step of forming a second semiconductor film containing an inert gas element on the barrier layer by a sputter method;

a sixth step of performing gettering of the metal element into the second semiconductor film to remove or reduce the metal element in the first crystallized semiconductor film; and a seventh step of removing the second semiconductor film.

In the above structure, the second semiconductor film is formed by a sputter method that an inert gas is introduced in a deposition chamber at a deposition pressure of 0.1 Pa to 5 Pa to cause glow discharge at an RF electric power density of 0.137 W/cm² to 6.847 W/cm².

Meanwhile, in the above structure, the metal element is for promoting crystallization of silicon and is one or a plurality of kinds selected from the group consisting of Fe, Ni, Co, Ru, Rh, Pd, Os, Ir, Pt, Cu and Au.

Meanwhile, in the above structure, the inert gas is one or a plurality of kinds selected from the group consisting of He, Ne, Ar, Kr and Xe. By containing such ions in the semiconductor film, a dangling bond or lattice defect is formed to thereby form a gettering site.

Meanwhile, by using a sputter process, after obtaining the second semiconductor film containing an inert gas element in a deposition stage, one or a plurality of kinds selected from the group consisting of inert gas elements H, $H_2$, O, $O_2$ and P may be added to the second semiconductor film. The addition of elements in plurality provides gettering effects in a multiplying fashion.

The semiconductor film thus obtained by the manufacturing method is suited as a semiconductor film having a distortion site to provide a gettering site. The application of the semiconductor having such distortion is not necessarily limited to a gettering site. For example, although different in technical field, there is a proposal of a technique for distortion-crystallization applied with stress distortion, as an art for newly improving transistor performance. It has been confirmed that, by providing distortion to a silicon crystal, electron and hole mobility is improved due to band structure change. This is expected as a new-generation art (Applied Physics, vol. 69 [11] (2000–11) p. 1315–1319). It can be considered that such an art will be further applied to the devices using thin films, such as TFTs, from now on.

Further, the amorphous semiconductor film comprising the inert gas element of the present invention can be used as gettering site for a semiconductor film which was crystallized by a different method from the one explained in Embodiment 1 and other general semiconductor films.

The semiconductor device of the invention, in a semiconductor device including an amorphous silicon film, is characterized in that: an Ar concentration in the amorphous silicon film is in a range of $1 \times 10^{19}$ to $1 \times 10^{22}/cm^3$, preferably $1 \times 10^{19}$ to $1 \times 10^{21}/cm^3$, more preferably $1 \times 10^{20}$ to $6 \times 10^{20}/cm^3$. Incidentally, the impurity concentration of oxygen, carbon or nitrogen is $5 \times 10^{15}/cm^3$ or less. Because the semiconductor device of the invention contains Ar at a concentration of $1 \times 10^{20}/cm^3$ or more in an amorphous-structured semiconductor film, it is possible to manufacture a semiconductor device having an amorphous silicon film having distortion. Meanwhile, because the Ar concentration in the amorphous silicon film is in the range of $1 \times 10^{20}$ to $6 \times 10^{20}/cm^3$. it is possible to manufacture a semiconductor device having a film not to be readily stripped off.

Meanwhile, the semiconductor device of the invention, in a semiconductor device including an amorphous silicon film, is characterized in that: a compression stress in the amorphous silicon film is in a range of $-10.0 \times 10^{10}$ dynes/$cm^2$ to $-5.0 \times 10^9$ dynes/$cm^2$. Because the semiconductor device of the invention has a compression stress in the amorphous silicon film in the range of $-10.0 \times 10^{10}$ dynes/$cm^2$ to $-5.0 \times 10^9$ dynes/$cm^2$, it is possible to manufacture a semiconductor device having an amorphous silicon film having distortion and not to be readily stripped off.

The manufacturing method for a semiconductor device of the invention is, in a manufacturing method for a semiconductor device to form an amorphous silicon film, a manufacturing method for a semiconductor device to form an amorphous silicon film by a sputter method using a silicon target in an Ar atmosphere while keeping a deposition pressure in a range of 0.2 to 1.0 Pa with a discharge due to RF (1 kHz to 30) MHz, preferably 10 to 20 MHz) in a room temperature (22 to 28° C., preferably 25° C.). In the manufacturing method for a semiconductor device of the invention, because the deposition pressure is kept at 0.2 to 1.0 Pa and a discharge due to RF (1 kHz to 30 MHz. preferably 10 to 20 MHz) is performed, the semiconductor device of the invention has an Ar concentration of the amorphous silicon layer in a range of $1 \times 10^{20}$ to $6 \times 10^{20}/cm^3$ and a compression stress of the amorphous silicon layer in a range of $-10.0 \times 10^{10}$ dynes/$cm^2$ to $-5.0 \times 10^9$ dynes/$cm^2$. Accordingly, it is possible to manufacture a semiconductor device having an amorphous silicon film having distortion and not to be readily stripped off.

DETAILED DESCRIPTION OF THE PREFERRED EMBODIMENTS

The embodiments of the present invention will now be explained.

This embodiment mode obtains a relationship between a concentration of an inert gas element (Ar) in an amorphous silicon film deposited by a sputter process and a deposition pressure. Experiment procedure is shown in the below.

An amorphous silicon film containing an inert gas element is formed on a class substrate by a sputter apparatus using an RF power supply. Using a silicon target, frequency is set at 1 kHz to 30 MHz, preferably 10 to 20 MHz and Ar is flowed to a deposition chamber. RF power (electrode size: diameter 30.5 cm) is 0.1 kW to 5 kW, herein 1.2 kW, and substrate temperature is a room temperature (22 to 28° C., herein 25° C.). Amorphous layers are formed one over another while changing the deposition pressure each time deposition is made to 0.2 μm. The deposition pressure is adjusted by a conductance valve on a discharge side. On a glass substrate, deposition is made in order with a thickness of 0.2 μm under each condition of deposition pressure 0.2 Pa, 0.4 Pa, 0.6 Pa, 0.8 Pa, 1.0 Pa and 1.2 Pa. Measurement is made for an Ar atomic concentration in the deposited film by a secondary ion mass spectroscopic method (SIMS).

Figure 2:
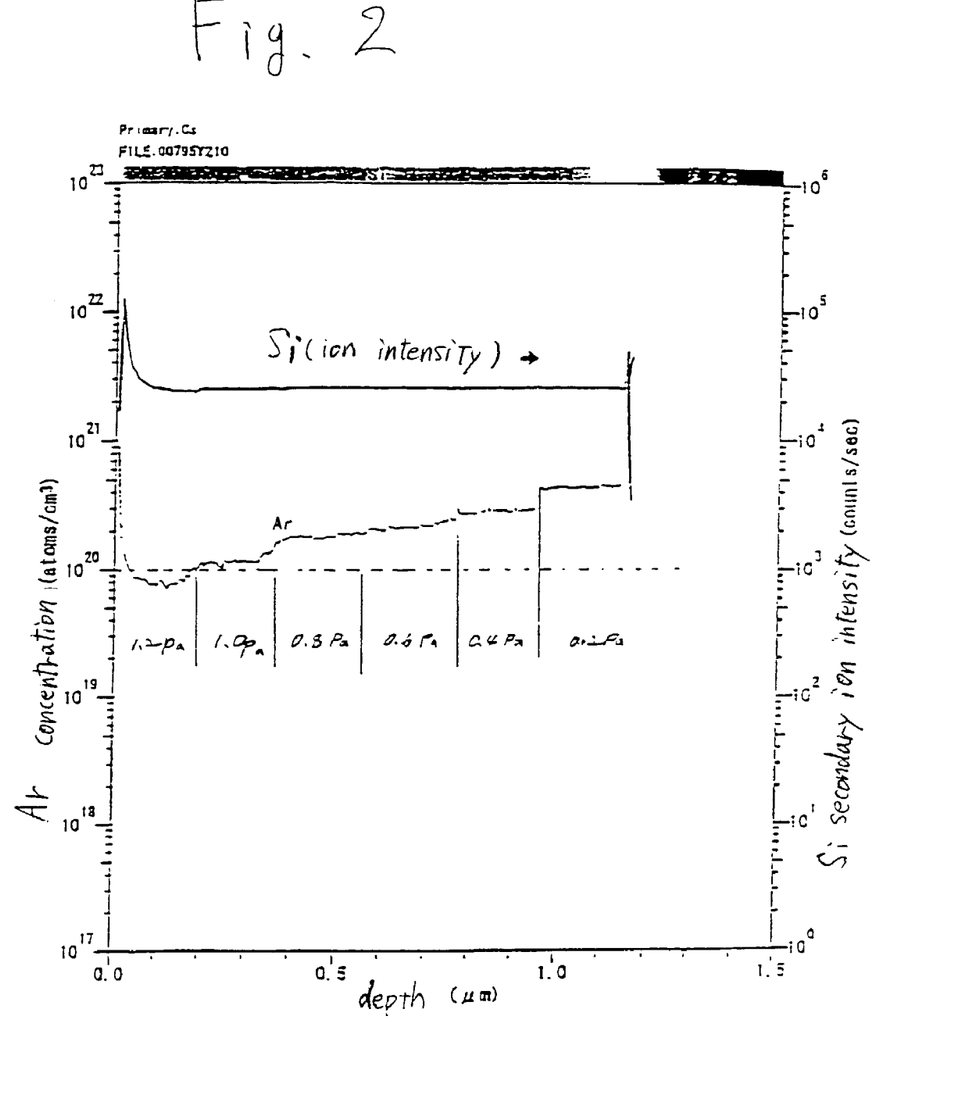
FIG. 2 is SIMS data (deposition pressure dependence) showing an Ar concentration in a silicon film deposited by a sputter process (RF scheme)

The obtained result is shown in FIG. 2. In FIG. 2, the vertical axis denotes an argon atom concentration while the horizontal axis denotes a depth from a sample surface. In addition, FIG. 2 shows also a silicon ion intensity, by taking a secondary ion intensity on the vertical axis and a depth from a sample surface on the horizontal axis.

From FIG. 2, it can be seen that, as the deposition pressure lowers, the Ar atom concentration in the film increases to enable film deposition suited for a gettering site. The fact the Ar atom concentration in the film increases with lowering in the deposition pressure includes a reason that recoil atoms are made ready to arrive at the substrate because the probability of bombardment between an Ar gas and a recoil atom (Ar atom reflected upon a target surface) within the reaction chamber decreases with decrease in sputter deposition pressure.

Then, measurement is made for the internal stress in an amorphous silicon film by using the same one as the sample used in FIG. 2. The result obtained is shown in FIGS. 3 and 4.

Figure 3:
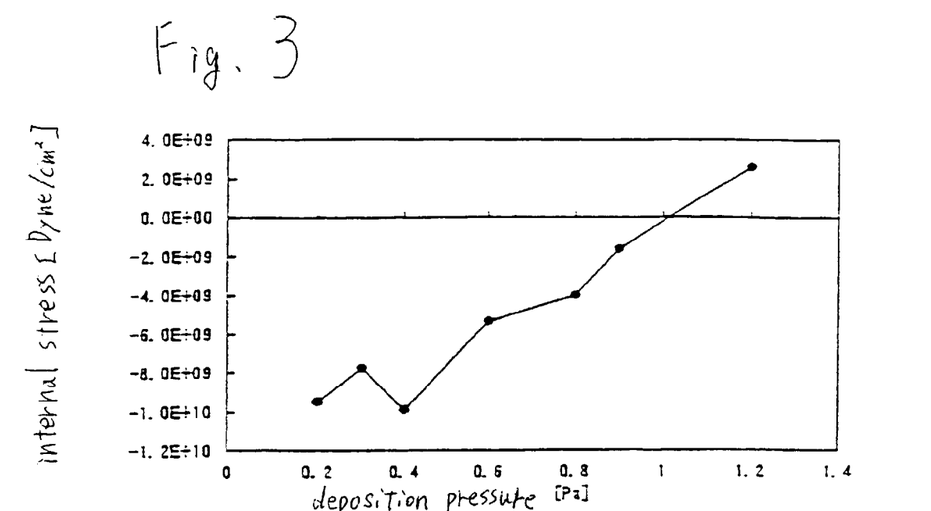
FIG. 3 is a graph showing a relationship between a deposition pressure and an internal stress in a silicon film deposited by the sputter process (RF scheme)

FIG. 3 shows a relationship between an internal stress in the film and a deposition pressure, showing that the compression stress increases with decrease in the deposition pressure.

Figure 4:
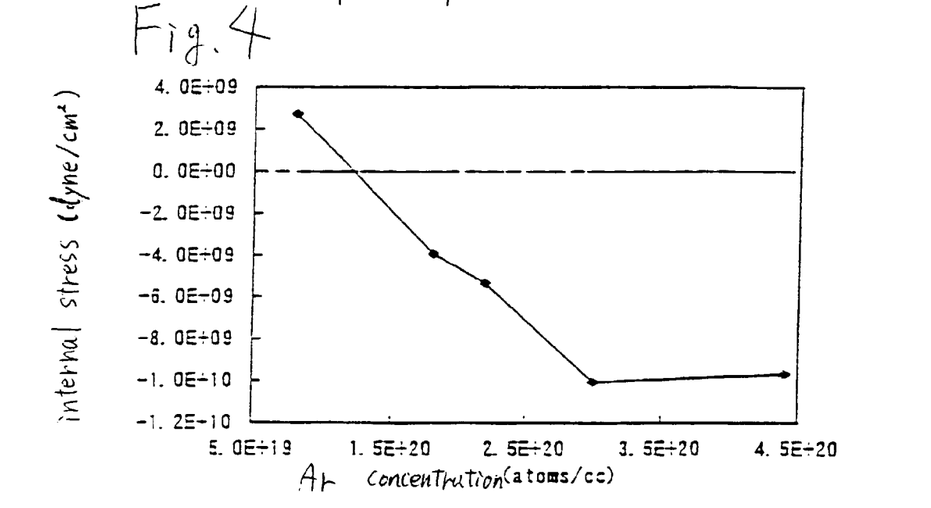
FIG. 4 is a graph showing a relationship between an Ar concentration and an internal stress in the silicon film deposited by the sputter process (RF scheme)

Meanwhile, FIG. 4 shows a relationship between an internal stress in the film and an Ar concentration, showing that the compression stress increases with increase in the concentration of Ar in the film. For example, an amorphous silicon film deposited at a deposition pressure in sputter of 1.0 Pa contains Ar at an atomic concentration of $1\times10^{20}/cm^3$, showing a compression stress (approx. $-4.7\times10^9$ (dynes/cm$^2$)). Meanwhile, as shown in FIG. 2 an amorphous silicon film deposited at a deposition pressure of 0.2 Pa contains Ar at an atom concentration of $6\times10^{20}/cm^3$, showing a compression stress (approx. $-9.47\times10^9$ (dynes/cm$^2$)). Incidentally, the present inventors presume that the lower limit of a compression stress not to strip the amorphous silicon film is $-10.0\times10^{10}$ (dynes/cm$^2$)). Accordingly, in order to form an amorphous silicon film having distortion and not to cause a strip of film during a post heat process, a sputter deposition pressure may be set at 0.2 Pa to 1.0 Pa. The amorphous silicon film, under such a sputter deposition pressure, has an Ar concentration of $1\times10^{20}/cm^3$ to $6\times10^{20}/cm^3$ and an internal stress of the amorphous silicon film of $-10.0\times10^{10}$ (dynes/Cm$^2$) to $-5.0\times10^9$ dynes/cm$^2$).

From the results of experiment, in the case of using an amorphous silicon film having distortion as an active layer of TFT, it may be formed by property set a deposition pressure and internal stress by the use of FIGS. 2, 3 and 4.

Then, a relationship is obtained between an inert gas element (Ar) concentration in an amorphous silicon film deposited by the sputter process and an RF electric power (or RF electric power density). The procedure of experiment is shown in the below.

An amorphous silicon film containing an inert gas element is deposited on a glass substrate by a sputter apparatus using an RF power supply. Using a silicon target (resistivity: 10 Ωcm), overlying layers are formed by sequentially changing the RF electric power each time a layer is formed to a thickness of 0.2 μm under the conditions of a frequency of 1 KHz to 30 MHz, preferably 10 to 20 MHz, an Ar flow to a deposition chamber of 50 sccm, a deposition pressure of 0.1 to 5 Pa, herein 0.4 Pa, and a substrate temperature of 300° C. or lower, herein 150° C. Note that the electrode has a size of 30.5 cm in diameter. The RF electric power density refers to a value the RF electric power divided by the electrode area. On the glass substrate, films are formed in order to a thickness of 0.2 μm under each of the conditions of an RF electric power of 0.4 kW. 0.5 kW, 1 kW and 3 kW. Measurement is made for an Ar atom concentration in the deposited film by the secondary ion mass spectroscopic method (SIMS).

Figure 5:
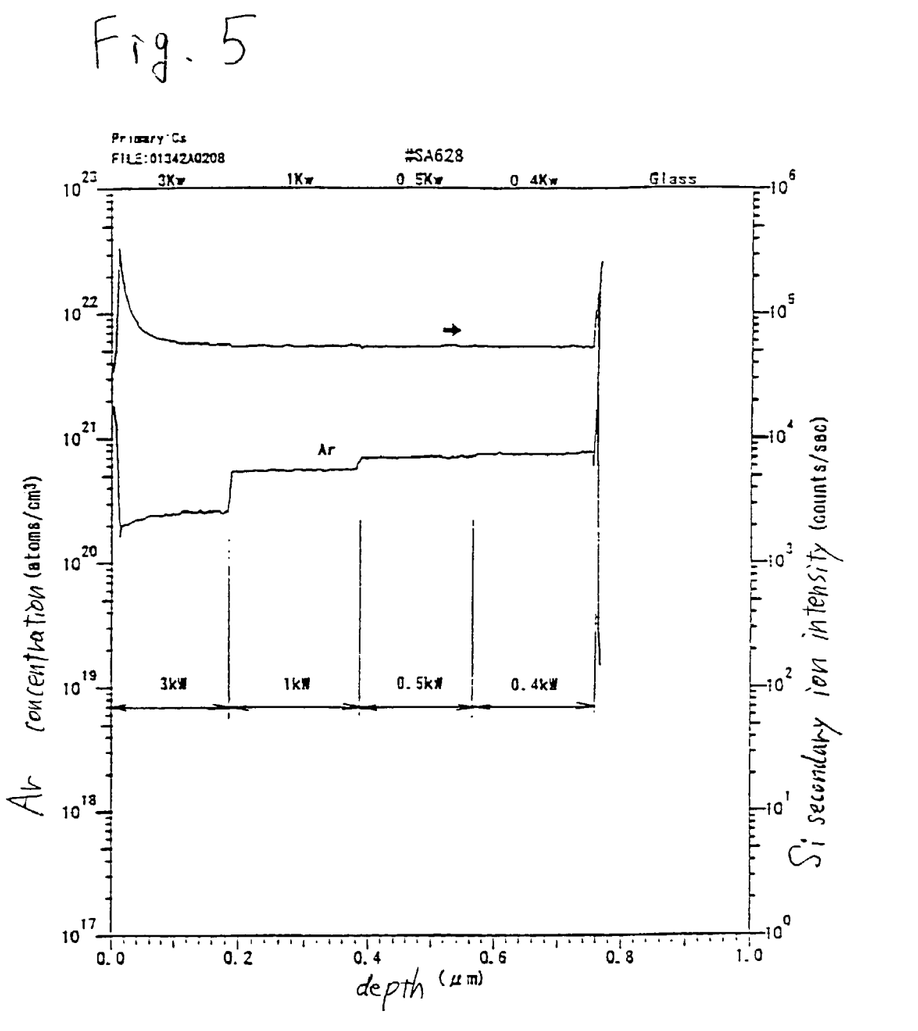
FIG. 5 is SIMS data (RF power dependence) showing an Ar concentration in a silicon film deposited by the sputter process (RF scheme)

The result obtained is shown in FIG. 5. In FIG. 5, the vertical axis denotes an Ar atom concentration while the horizontal axis denotes a depth from a sample surface. In addition, a silicon ion intensity is also shown in FIG. 5, wherein a secondary ion intensity is taken on the vertical axis and a depth from the sample surface is on the horizontal axis.

From FIG. 5, it can be seen that Ar atom concentration in the film increases with decrease in the RF electric power (or RF electric power density), making possible to form a film suited as a gettering site. Meanwhile, internal stress can be decreased with decrease in the RF electric power (or RF electric power density), which causes less film stripping.

From these results of experiment, a suitable gettering site (amorphous silicon film containing an inert gas element) may be formed by appropriately setting a deposition pressure and RF electric power (or RF electric power density) using FIGS. 2 to 5.

Meanwhile, a relationship is obtained, as a comparative example, between an inert gas element (Ar) concentration in an amorphous silicon film deposited by a DC-schemed sputter process and a deposition pressure. Experiment procedure is shown in the below.

Figure 6:
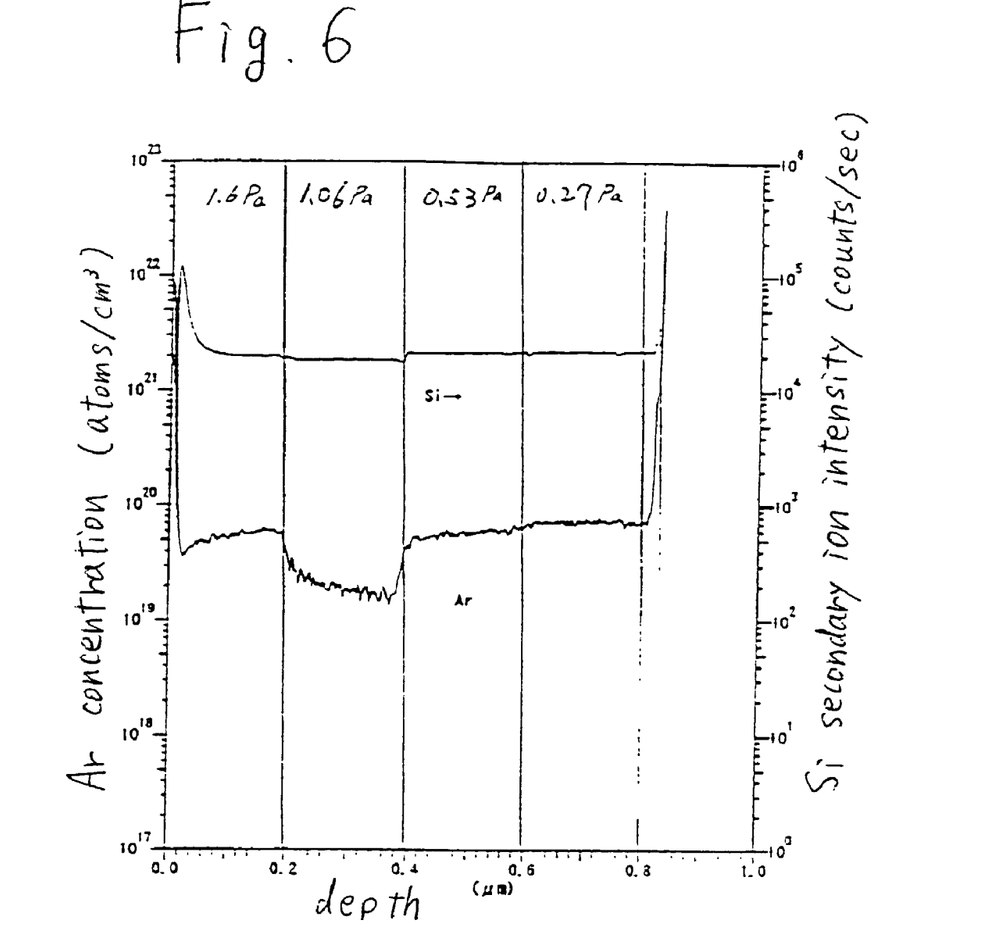
FIG. 6 is SIMS data showing an Ar concentration in a silicon film deposited by a sputter process (DC scheme)

With a sputter apparatus using a DC power supply, an amorphous silicon film containing an inert gas element is formed on a glass substrate. Using a silicon target (resistivity: 0.2 Ωcm), Ar is flowed into a deposition chamber at 80 sccm. The deposition pressure is changed every thickness of 0.2 μm at a DC electric power of 3 kW (DC electric power density: 2.5 W/cm$^2$) and substrate temperature of 150° C. Note that deposition pressure is adjusted by a conductance valve at the exit side. On a glass substrate, deposition is made in order with a thickness of 0.2 μm under each condition of deposition pressure 0.27 Pa, 0.53 Pa, 1.06 Pa and 1.6 Pa. Measurement is made for an Ar atom concentration in the deposited film by the secondary ion mass spectroscopic method (SIMS). The obtained result is shown in FIG. 6. In FIG. 6, the vertical axis denotes an Ar atom concentration while the horizontal axis denotes a depth from a sample surface. In addition, FIG. 6 shows also a silicon ion intensity, wherein a secondary ion intensity is taken on the vertical axis and a depth from a sample surface is on the horizontal axis.

As shown in FIG. 6, with the DC-schemed sputter apparatus, Ar of $1\times12^{20}/cm^3$ or more could not be contained in the amorphous silicon film. In respect of this, the present inventors presumably consider a cause related to deposition rate. Note that, in FIG. 6, an Ar concentration at 1.06 Pa would be abnormal due to a certain cause and hence not reliable data.

The data in the above indicates that the invention preferably employs an RF-schemed sputter apparatus capable of containing an inert gas element with a high concentration in a film, rather than a DC-schemed sputter apparatus.

The invention above structured will be explained with greater detail in the below embodiments.

[Embodiment 1]

The manufacturing steps of typical TFT using the present invention is briefly shown in FIGS. 1A through 1G.

Figure 1A:
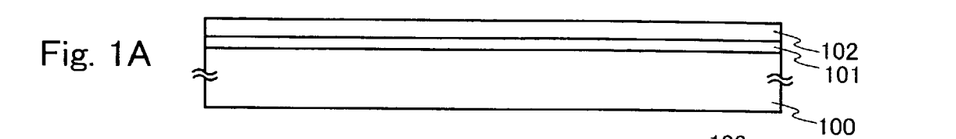
FIGS. 1A through 1G are views showing a manufacturing process for a semiconductor device of the invention.

FIG. 1A includes a substrate 100 having an insulating surface, an insulating film 101 functioning as a blocking layer, and a semiconductor film 102 having an amorphous structure.

In FIG. 1A, the substrate 100 may be a glass substrate, a quartz substrate or a ceramic substrate. Alternatively, the substrate 100 may be a silicon substrate, a metal substrate or a stainless substrate, which has an insulating film formed on the surface. The substrate 100 may be a plastic substrate having heat resistance, which withstands a processing temperature during the processes.

First of all, the primary insulating film 101 is formed which may be an oxide silicon film, a nitride silicon film or a silicon oxide nitride film ($SiO_xN_y$), on the substrate 100, as shown in FIG. 1A. In a typical example, the primary insulating film 101 has a two-layer structure in which first and second silicon oxide nitride films are stacked. The first silicon oxide nitride film is formed in 50 to 100 nm thick by using $SiH_4$, $HN_3$ and $N_2O$ as a reaction gas. The second silicon oxide nitride film is formed in 100 to 150 nm thick by using $SiH_4$ and $N_2O$ as a reaction gas. Preferably, the one layer of the primary insulating layer 101 is a silicon nitride film (SiN film) in 10 nm thick or below or the second silicon oxide nitride film ($SiO_xN_y$ film (x>>y)). During gettering. nickel tends to easily move to an area with a higher concentration of oxygen. Therefore, it is extremely effective to have a silicon nitride film as the primary insulating film adjacent to the semiconductor film. Alternatively, the primary insulating film 101 may have a three layer structure in which a first silicon oxide nitride film, a second silicon oxide nitride film and a silicon nitride film are stacked sequentially.

Next, the first semiconductor film 102, which has an amorphous structure, is formed on the primary insulating film 101. The first semiconductor film 102 may be formed by using a semiconductor material mainly containing silicon. Typically, the first semiconductor film 102 may be an amorphous silicon film or an amorphous silicon germanium film and may be formed in 10 to 100 nm thick by the plasma CVD method, the vacuum CVD or the sputtering method. In order to obtain a semiconductor film having a good quality crystalline structure in later crystallization, the impurity concentration of oxygen and nitrogen contained in the first semiconductor film 102 having an amorphous structure may be $5 \times 10^{18}/cm^3$ (an atomic density measured by the Secondary Ion Mass Spectrometry: SIMS) or below. These impurities prevent the later crystallization and increase the density of the trapping center and the recombination center even after the crystallization. Thus, it is desirable that a material gas with high purity is used. Further, it is desirable to use a CVD device including a reaction chamber with a mirror treatment (electric field polishing processing) or compliant with ultra high vacuum including an oil-free vacuum exhausting system.

Figure 1B:
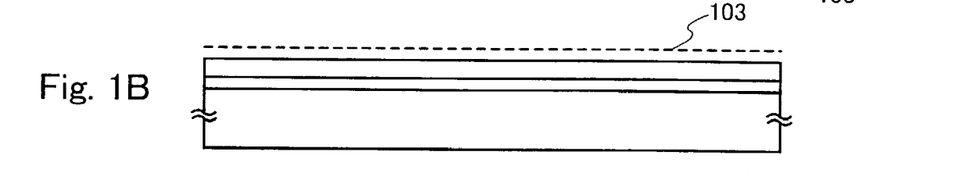

Next, the first semiconductor film 102 having the amorphous structure is crystallized by using a technology disclosed in Japanese Patent Laid Open No. 78329/1996. According to the technology, a metal element, which facilitates the crystallization, is added to the amorphous silicon film (also referred to as an amorphous silicon film), and heating processing is performed thereon. Thus, a semiconductor film having crystal structure grown from an added region of the metal element as a start point is formed. First of all, nickel acetate solution containing a metal element (nickel, here) of 1 to 100 ppm on a weight basis, which has catalysis properties facilitating the crystallization, is coated by using a spinner on the surface of the first semiconductor film 102 having the amorphous structure. Thus, a nickel contained layer 103 is formed (FIG. 1B). In addition to the method of forming the nickel contained layer 103 by coating, a method may be used whereby an extremely thin film is formed by using sputtering method, vapor deposition method or plasma processing. While the example of coating performed on all the surface is described, a mask may be formed and a nickel contained layer may be selectively formed.

Figure 1C:
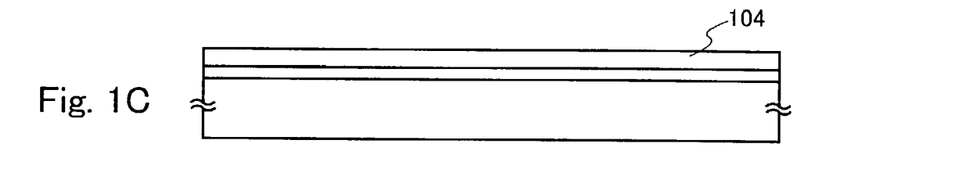

Next, heating processing is performed for the crystallization. In this case, suicide is formed at a portion of the semiconductor film contacted with the metal element facilitating the crystallization of the semiconductor is formed, and the suicide is used as a nucleus in order to advance the crystallization. A first semiconductor film 104 having a crystalline structure shown in FIG. 1C is formed in this way. The concentration of oxygen contained in the first semiconductor film 104 after the crystallization is desirably $1 \times 10^{20}/cm^3$ or below. Here, after the thermal processing (at 450° C. for one hour) for the dehydrogenation, thermal processing for the crystallization (4 to 24 hours at 550° C. to 650° C.) is performed. When the crystallization is performed by irradiating strong light. any one or a combination of infrared light, visible light and ultra-violet light may be used. Typically, light is used which is emitted from a halogen lump. a metal halide lamp, a xenon-arc lamp, a carbon-arc lamp, a high-pressure sodium lamp or a high-pressure mercury lamp. The lamp light source is lighted up for 1 to 60 seconds or, preferably, for 30 to 60 seconds. The lightning may be repeated one to ten times until the semiconductor film is heated shortly to the order of 600° C. to 1000° C. If necessary, thermal processing may be performed before the irradiation of the strong light in order to release hydrogen contained in the first semiconductor film 104 having the amorphous structure. Thermal processing and the irradiation of the strong light may be performed at the same time for the crystallization. In consideration of the productivity. the crystallization is preferably performed by the irradiation of the strong light.

The metal element (nickel, here) remains in the first semiconductor film 104 obtained in this way. The metal element does not distribute in the film uniformly, but the average concentration of the remained metal element is over $1 \times 10^{19}/cm^3$. A TFT and the other different kinds of semiconductor elements can be formed even under the condition, but the element is removed in accordance with a method as the following.

Next, in order to increase a rate of crystallization (a rate of a crystal component in a whole volume of the film) and to repair defects remained within crystal grains, it is preferable that laser light is irradiated to the first semiconductor film 104 having the crystalline structure. Note that it is preferable that an oxide film is removed from the surface of a silicon film by inert hydrofluoric acid before irradiation of a laser light. When the laser light is irradiated, a thin oxidized film (not shown in the figure) is formed on the surface. The laser light may be excimer laser light with a wave length of 400 nm or below or may be the second or the third harmonic of YAG laser.

Figure 1D:
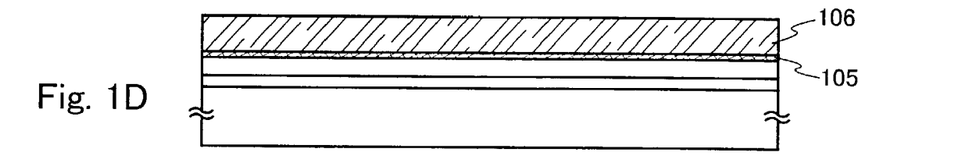
Figure 1E:
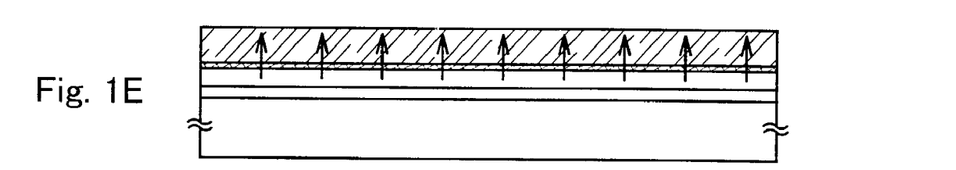

The oxide film formed by irradiating the laser light after the above crystallization is insufficient. Therefore, an oxide film is formed by using ozone contained solution (typically, ozone water), which is called chemical oxide. Then, a barrier layer 105 having an oxide film of 1 to 10 nm in total is formed. A second semiconductor film 106 containing an inert gas element is formed on the barrier layer 105 (FIG. 1D). Here. the oxide film, which is formed when laser light is irradiated to the first semiconductor film 104 having the crystalline structure, is regarded as a part of the barrier layer, here. The barrier layer 105 functions as an etching stopper when only the second semiconductor film 106 is selectively removed in the later process. The chemical oxide may be formed similarly by using solution, in which sulfuric acid, hydrochloric acid or nitric acid and hydrogen peroxide solution are mixed, instead of the ozone contained solution. Alternatively, the barrier layer 105 may be formed by causing ozone by the irradiation of ultraviolet rays in an atmosphere of oxygen and then oxidizing, the surface of the semiconductor film having the crystalline structure. The barrier layer 105 may be formed by depositing an oxidized film 1 to 10 nm thick by plasma CVD method, sputtering method or vapor-deposition method. Alternatively, the barrier layer 105 may be formed by using a clean oven to heat the semiconductor film at the order of 200 to 350° C. and then forming a thin oxide film. However, the proper quality or thickness of the barrier layer 105 formed by one of the above mentioned methods or another method is required so that nickel contained in the first semiconductor film can move to the second semiconductor film during later gettering.

Here, the second semiconductor film 106 containing an inert gas element is formed by using sputtering method to form a gettering site. The inert gas element may be any one or multiple kinds of helium (He), neon (Ne), argon (Ar), krypton (Kr) and xenon (Xe). Among the above. Argon (Ar) is preferable because of the low price. Here, a target having silicon is used in an atmosphere containing the inert gas element, to form the second semiconductor film with a deposition pressure at 0.1 Pa to 5 Pa and with an electronic density at 0.137 W/cm$^2$ to 6.847 W/cm$^2$. There are two reasons why an inert gas element ion, which is an inert gas, is contained in the film. One reason is for forming a dangling bond to give distortion in the semiconductor film. The other reason is for giving interstitial distortion in the semiconductor film. The interstitial distortion in the semiconductor film may be significantly obtained when an element with a larger atomic radius than that of silicon is used such as argon (Ar), krypton (Kr), and xenon (Xe). Furthermore, containing the inert gas element in the film may not only cause the lattice distortion but also form dangling bond, which contributes to the gettering action.

When the second semiconductor film is formed by using a target containing phosphorous, which is one conductivity type of impurity element, Coulomb force of phosphorous may be used to perform gettering in addition to the gettering by using the inert gas element.

Because nickel tends to move toward a high oxygen concentration region during gettering, the oxygen contained in a second semiconductor film 106 desirably has a higher concentration, e.g. $1 \times 10^{20}$/cm$^3$ or higher, than the oxygen contained in a first semiconductor film. Accordingly, the deposition pressure of 1.2 Pa. 1.0 Pa, 0.8 Pa. 0.6 Pa, 0.4 Pa or 0.2 Pa satisfies the oxygen concentration.

In the case that the inert gas element is added also to the first semiconductor film in the deposition by the sputter process of FIG. 1D, the region thus added serves as a gettering site. Thus, there is a concern that the gettering effect is lowered. Consequently, it is desired to properly adjust the sputter condition such that the inert gas element is not added to the first semiconductor film. Meanwhile, because a barrier layer. during the deposition by a sputter process, serves to prevent against inert gas addition, the film thickness and quality of a barrier layer is of importance. According to an experiment by the present inventors, preferred as a barrier layer is an oxide film having an overall film thickness of 10 nm or smaller obtained by forming an oxide film upon irradiating a laser light to enhance crystallization ratio and repair the defects left in crystal grain and further forming an oxide film by using an ozone-contained solution. Meanwhile, in the case that an oxide film formed due to irradiating a laser light is removed and then a barrier layer is formed only by an oxide film with using an ozone-contained solution, the inert gas element during the deposition by, the sputter process is slightly added also to the first semiconductor film. Accordingly the barrier layer formed above is unsatisfactory for the barrier layer.

Then, a heating process is conducted for getterinng to reduce or remove the concentration of the metal element (nickel) in the first semiconductor layer. (FIG. 1E) The heating process for gettering may be by an intense-light irradiating process or thermal process. By the gettering, metal element moves in a direction of the arrow in FIG. 1E (i.e. in a direction from a substrate side toward the second semiconductor layer). This removes the metal element contained in the first semiconductor film 104 covered by the barrier layer 105 or reduces the concentration of the metal element. The moving distance of metal element during gettering may be at least a distance of nearly a thickness of the first semiconductor film. This can complete gettering in a comparatively short time. Herein, nickel in all is moved into the second semiconductor film 106 without being segregated in the first semiconductor film 104. Gettering is sufficiently done such that almost no nickel is contained in the first semiconductor film 104, i.e., the nickel concentration in the film is $1 \times 10^{18}$/cm$^3$ or less, desirably $1 \times 10^{17}$/cm$^3$ or less.

Incidentally, there is a possibility that the second semiconductor film partially crystallizes depending on a condition of a heating process for getterinng or a thickness of the second semiconductor film. The crystallization in the second semiconductor film reduces dangling bonds, lattice distortion or unpaired bonds, to incur the lower in the gettering effect. Preferably, heating condition or second semiconductor film thickness is provided not to cause crystallization in the second semiconductor film. In any rate, the second semiconductor film. or amorphous silicon film containing an inert gas element, causes less crystallization as compared to an amorphous silicon film not containing an inert gas element, and hence suited as a gettering site.

Under a certain heating condition for gettering, the crystallization ratio in the first semiconductor film can be enhanced simultaneously with gettering to thereby repair the defects left in crystal grain. i.e. to improve crystallinity.

In the description, gettering refers to that the metal element in a to-be-gettered region (herein, first semiconductor film) is released by heat energy and moved into a gettering site by diffusion. Consequently, gettering relies upon process temperature, i.e. gettering proceeds in a shorter time at higher temperature.

In the case of using a process to irradiate an intense light, a lamp light source for heating is put on for 1 to 60 seconds, preferably 30 to 60 seconds, which is repeated 1 to 10 times, preferably 2 to 6 times. Although the lamp light source has an arbitrary light-emission intensity, it is preferred to instantaneously heat up the semiconductor film to 600–1,000° C. preferably approximately 700 to 750° C.

Meanwhile, in the case with a heat process, the heat process may be in a nitrogen atmosphere at 450 to 800° C. for 1 to 24 hours, e.g. at 550° C. for 14 hours. The heat process may be added with intense light radiation.

Then, the barrier layer 105 is used as an etching stopper to selectively remove only the second semiconductor film shown at 106. Then, the barrier layer 105 is removed away, and the first semiconductor film 104 is formed into a semiconductor layer 107 having a desired shape by using a known patterning technique. (FIG. 1F) The method for selectively etching only the second semiconductor film can be conducted by dry etching not using a CIF$_3$ plasma or by wet etching with an alkali solution, such as a solution containing hydrazine or tetraethylammonium hydrooxide (chemical formula: (CH$_3$)4NOH). After removing the second semiconductor film, when a nickel concentration is measured in a surface of the barrier layer by TXRF, nickel is detected at high concentration. Accordingly, the barrier layer is preferably removed. It may be removed by an etchant containing hydrogen fluoride. Meanwhile, after removing the barrier layer but before forming a resist mask, it is preferred to form a thin oxide film at the surface with using an ozone water.

Figure 1F:
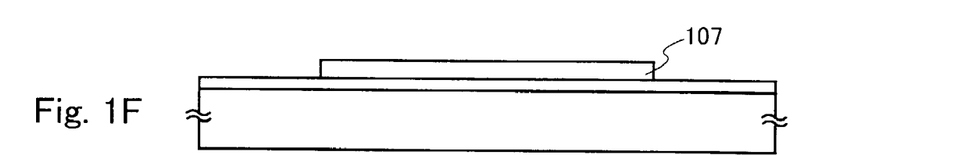

Then, the semiconductor layer at its surface is cleaned by an etchant containing hydrogen fluoride, and then an insulating film for a gate insulating film 108 is formed based on silicon. The surface cleaning and gate insulating film forming is preferably carried out continuously without being exposed to the air.

Then, after cleaning the surface of the gate insulating film 108, a gate electrode 109 is formed. Subsequently, an impurity element (P, As or the like) for giving an n-type to the semiconductor, herein phosphorus, is added properly to form a source region 110 and a drain region 111. After the addition, a heating process, intense light radiation or laser light radiation is carried out to activate the impurity element. The plasma damages to the gate insulating film and to the interface between the gate insulating are repaired film and the semiconductor layer are repaired simultaneously with activation of the impurity element. Particularly, it is very effective to activate the impurity element by radiating a second harmonic of YAG laser at the main or back surface in an atmosphere at a room temperature to 300° C. A YAG laser is preferable activating means because of its less maintenance.

In the subsequent process, an interlayer insulating film 113 is formed and hydrogenated to form contact holes reaching the source and drain regions. A source electrode 114 and drain electrode 115 are formed to complete a TFT (n-channel TFT). (FIG. 1G)

Figure 1G:
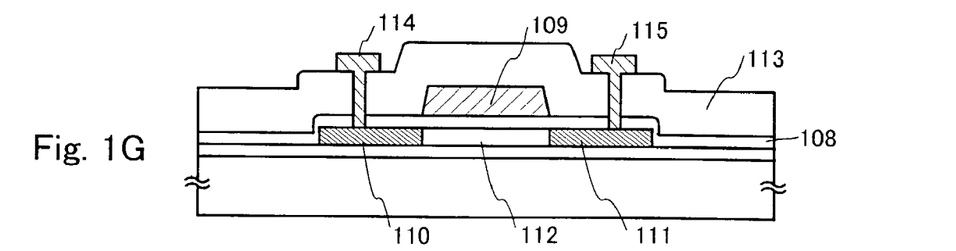

The invention is not limited to the TFT structure of FIG. 1G but may be, if required, of a lightly doped drain (LDD) structure having an LDD region between the channel region and the drain region (or source region). This structure has a region added with an impurity element at low concentration at between the channel region and the source or drain region formed with an impurity element at a high concentration. This region is called an LDD region. Furthermore, it is possible to use so-called a GOLD (Gate-drain Overlapped LDD) structure having an LDD region overlapped with the gate electrode through a gate insulating film.

Although this embodiment is explained by the use of the n-channel TFT, it is needless to say that a p-channel TFT can be formed by using a p-type impurity element in place of the n-type impurity element.

Also, although this embodiment is explained by exemplifying a top-gate TFT, the invention is applicable irrespectively of a TFT structure, i.e. applicable to a bottom-gate (inverted stagger) TFT or forward-stagger TET, for example.

[Embodiment 2]

This embodiment explains an example using, as a TFT active layer, a semiconductor film having distortion obtained by the invention.

This embodiment forms, as a semiconductor film having distortion, an amorphous silicon film by a sputter process using a silicon target in an Ar atmosphere, wherein electric discharge is caused using RF (1 kHz to 30 MHz. preferably 10 to 20 MHz) in a room temperature (22 to 28° C., preferably 25° C.) to keep a deposition pressure in a range of 0.2 to 1.0 Pa. Due to the foregoing depositing condition, the semiconductor device of the invention has, in an amorphous silicon layer, an Ar concentration in a range of $1 \times 10^{20}$ to $6 \times 10^{20}/cm^3$. Furthermore, the amorphous silicon layer has therein a compression stress in a range of $-10.0 \times 10^{10}$ dynes/cm$^2$ to $-5.0 \times 10^9$ dynes/cm$^2$. Thus, a semiconductor device can be manufactured which has a distorted amorphous silicon film not easily to be stripped off.

The structure other than the active layer is satisfactorily fabricated by using a known technique and hence omittedly explained herein. This embodiment is applicable irrespectively of a TFT structure, i.e. applicable to a bottom-gate (inverted stagger) TFT. a forward-stagger TFT or a top-gate TFT, for example.

[Embodiment 3]

A pixel portion and a driver circuit, which use an amorphous semiconductor film or a crystallized semiconductor film formed by implementing the present invention as an active layer of a TFT can be used in various modules (active matrix type liquid crystal module, active matrix type EL module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 7A through 7F, 8A through 8C and 9A through 9C.

Figure 7A:
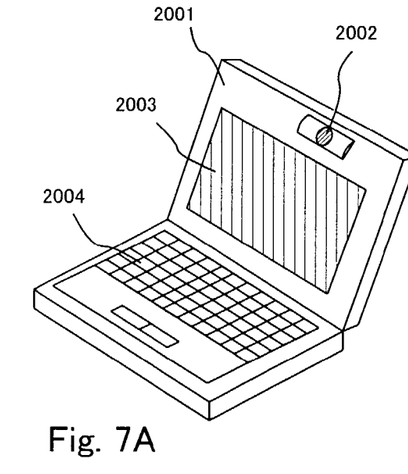
FIGS. 7A through 7F are views showing examples of electronic appliances.

FIG. 7A shows a personal computer including a main body 2001, an image input portion 2002, a display portion 2003 and a keyboard 2004. The present invention can be applied to the display portion 2003.

Figure 7B:
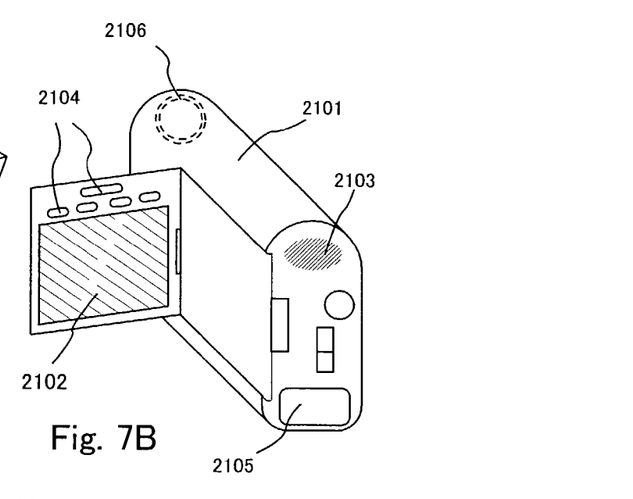

FIG. 7B shows a video camera including a main body 2101, a display portion 2102. a voice input portion 2103, operation switches 2104, a battery 2105 and an image receiving portion 2106. The present invention can be applied to the display portion 2102.

Figure 7C:
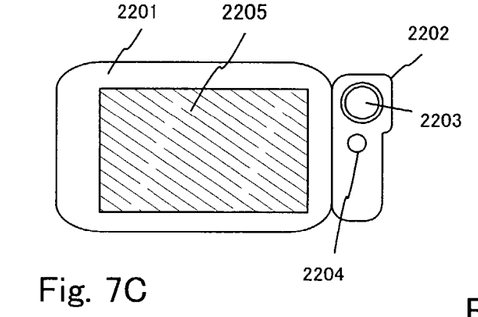

FIG. 7C shows a mobile computer including a main body 2201, a camera portion 2202, an image receiving portion 2203, an operation switch 2204 and a display portion 2205. The present invention can be applied to the display portion 2205.

Figure 7D:
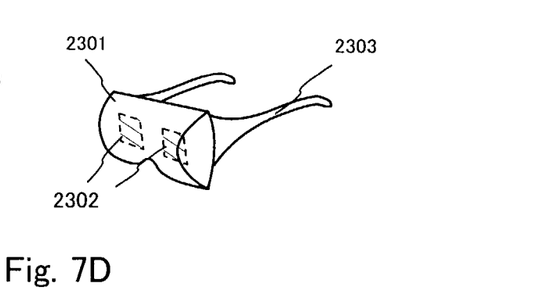

FIG. 7D shows a goggle type display including a main body 2301, a displan, portion 2302 and an arm portion 2303. The present invention can be applied to the display portion 2302.

Figure 7E:
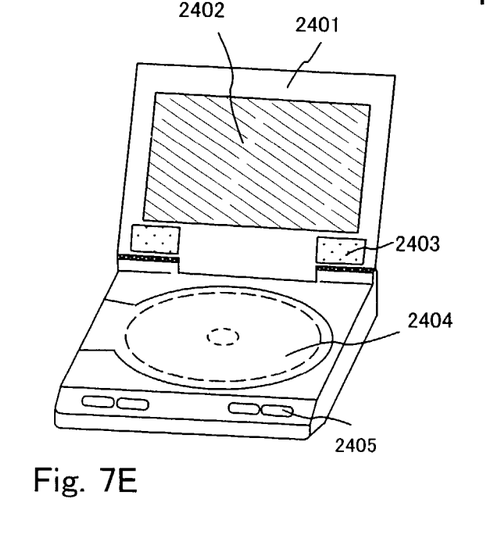

FIG. 7E shows a player using a record medium recorded with programs (hereinafter, referred to as record medium) including a main body 2401, a display portion 2402. a speaker portion 2403, a record medium 2404 and an operation switch 2405. The player uses DVD (digital Versatile Disc) or CD as the record medium and can enjoy music, enjoy movie and carry out game or Internet. The present invention can be applied to the display portion 2402.

Figure 7F:
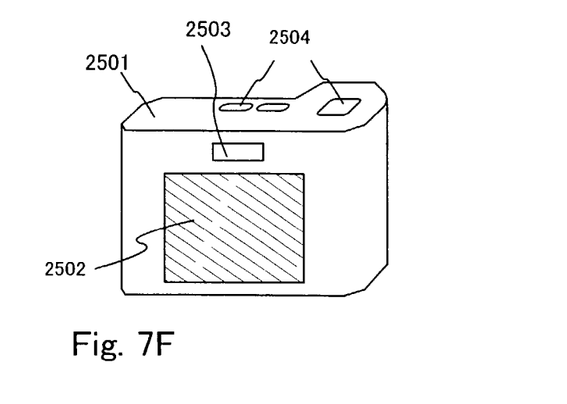

FIG. 7F shows a digital camera including a main body 2501, a display portion 2502, an eye contact portion 2503, operation switches 2504 and an image receiving portion (not illustrated). The present invention can be applied to the display portion 2502.

Figure 8A:
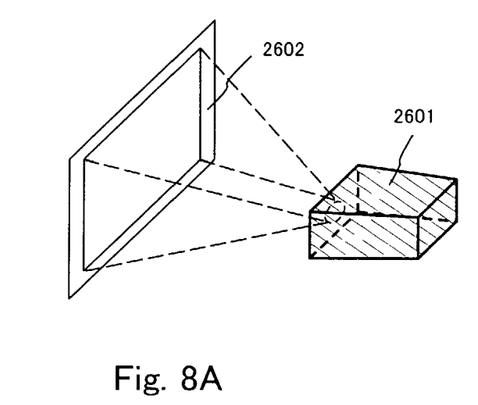
FIGS. 8A through 8D are views showing examples of electronic appliances.

FIG. 8A shows a front type projector including a projection equipment 2601 and a screen 2602. The present invention can be applied to the liquid crystal module 2808 forming a part of the projection equipment 2601.

Figure 8B:
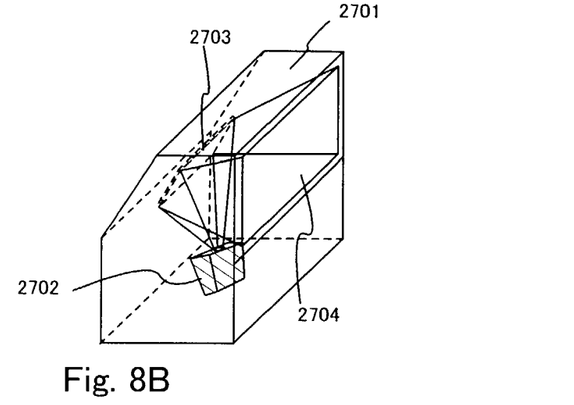

FIG. 8B shows a rear type projector including a main body 2701, a projection equipment 2702, a mirror 2703 and a screen 2704. The present invention can be applied to the liquid crystal module 2808 forming a part of the projection equipment 2702.

Figure 8C:
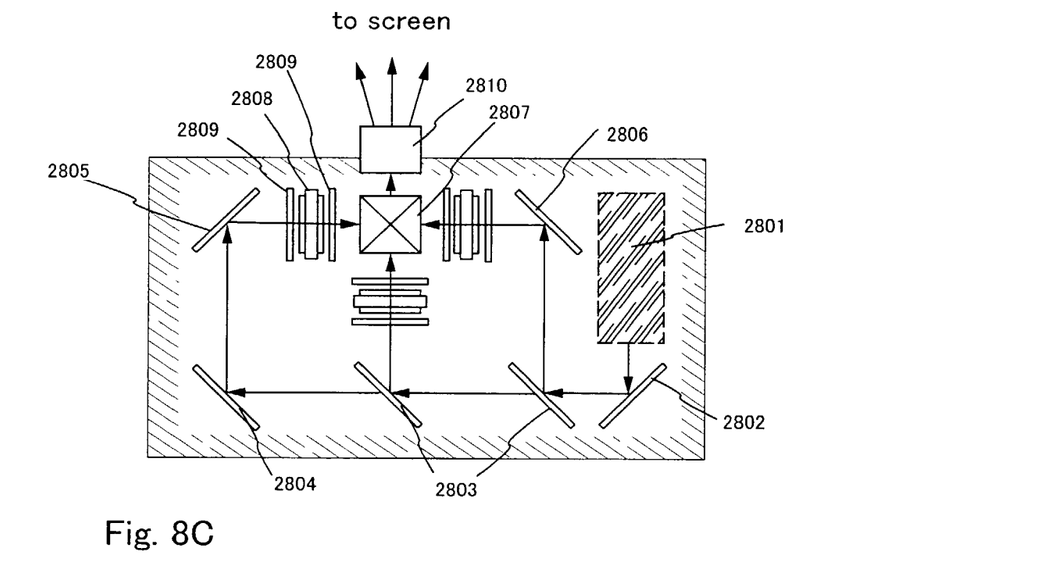

Further, FIG. 8C is a view showing an example of a structure of the projection equipment 2601 and 2702 in FIG. 8A and FIG. 8B. The projection equipment 2601 or 2702 is constituted by a light source optical system 2801 mirrors 2802, and 2804 through 2806, a dichroic mirror 2803, a prism 2807, a liquid crystal module 2808, a phase difference plate 2809 and a projection optical system 2810. The projection optical system 2810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 8C.

Figure 8D:
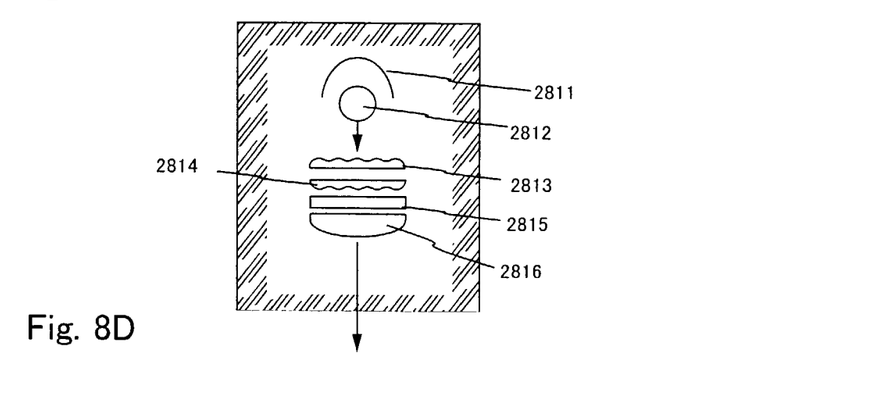

Further, FIG. 8D is a view showing an example of a structure of the light source optical system 2801 in FIG. 8C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 8D is only an example and this example is not particularly limited thereto. For example, a person of executing this embodiment may pertinently provide an optical system such as an optical lens, a film having a polarization function, a film for adjusting a phase difference or an IR film in the light source optical system.

However, according to the projectors shown in FIGS. 8A through 8D, there is shown a case of using a transmission type electro-optical device and an example of applying a reflection type electro-optical device and EL module are not illustrated.

Figure 9A:
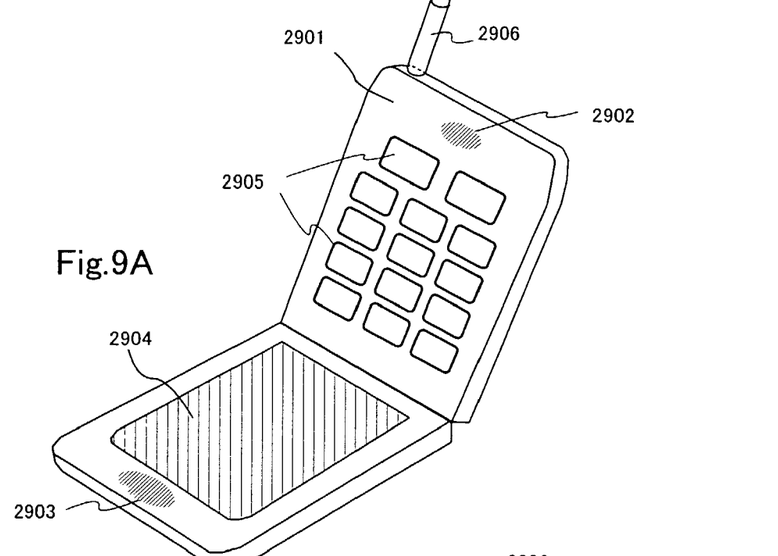
FIGS. 9A through 9C are views showing examples of electronic appliances.

FIG. 9A shows a cellular phone including a main body 2901, a sound output portion 2902, a sound input portion 2903, a display portion 2904, an operation switch 2905, an antenna 2906 and an image input portion (CCD, image sensor or the like) 2907. The present invention can be applied to display portion 2904.

Figure 9B:
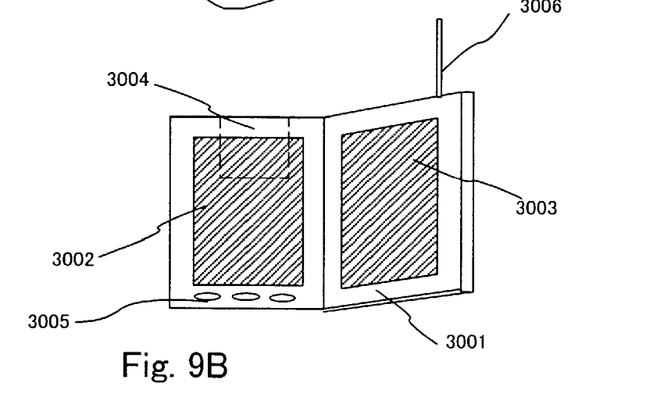

FIG. 9B shows a portable book (electronic book) including a main body 3001, display portions 3002 and 3003, a record medium 3004, an operation switch 3005 and an antenna 3006. The present invention can be applied to display portions 3002 and 3003.

Figure 9C:
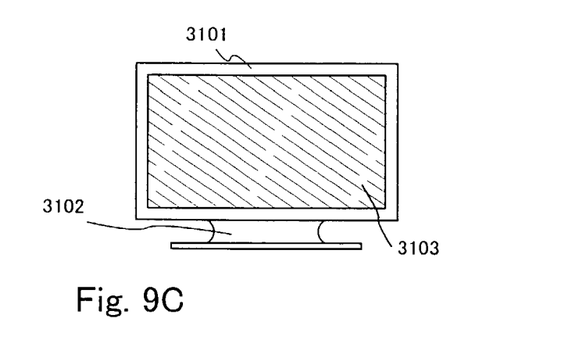

FIG. 9C shows a display including a main body 3101, a support base 3102 and a display portion 3103. The present invention can be applied to display portion 3103.

In addition, the display shown in FIG. 9C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Embodiment modes, Embodiments 1 and 2.

The present invention allows a film to contain argon at a high concentration. specifically, at a concentration of $1 \times 10^{19}/cm^3$ to $1 \times 10^{22}/cm^3$. Thus, an amorphous silicon film having a distortion. not to be readily stripped off, can be formed by a sputter process.

What is claimed is:

1. A method of manufacturing a semiconductor device comprising:
   forming a first semiconductor film over an insulating surface;
   forming a barrier film on the first semiconductor film;
   forming a second semiconductor film on the barrier film by sputtering, the second semiconductor film comprising an inert gas element at a concentration of $1 \times 10^{19} cm^3$ to $1 \times 10^{22}/cm^3$;
   performing gettering of an impurity into the second semiconductor film to remove or reduce the impurity in the first semiconductor film; and
   removing the second semiconductor film,
   wherein a compression stress in the second semiconductor film has a range from $-10.0 \times 10^{10}$ dynes/cm$^2$ to $-5.0 \times 10^9$ dynes/cm$^2$, and
   wherein an RF electric power density in the step of forming the second semiconductor film is 0.137 to 6.847 W/cm$^2$.

2. A method for manufacturing a semiconductor device according to claim 1, wherein the inert gas is at least one gas selected from the group consisting of He, Ne, Ar, Kr and Xe.

3. A method for manufacturing a semiconductor device according to claim 1, wherein the semiconductor device is incorporated into an electronic device selected from the group consisting of: a personal computer, a video camera, a mobile computer, a goggle type display, a player using a record medium, a digital camera, cellular phone, portable book, and a display.

4. A method of manufacturing a semiconductor device comprising:
   forming a first semiconductor film over an insulating surface;
   forming a barrier film on the first semiconductor film;
   forming a second semiconductor film on the barrier film by sputtering in an atmosphere including an inert gas;
   performing gettering of an impurity into the second semiconductor film to remove or reduce the impurity in the first semiconductor film; and
   removing the second semiconductor film by etching,
   wherein a compression stress in the second semiconductor film is with a range from $-10.0 \times 10^{10}$ dynes/cm$^2$ to $-5.0 \times 10^9$ dynes/cm$^2$, and
   wherein an RF electric power density in the step of forming the second semiconductor film is 0.137 to 6.847 W/cm$^2$.

5. A method for manufacturing a semiconductor device according to claim 4, wherein the inert gas is at least one gas selected from the group consisting of He, Ne, Ar, Kr and Xe.

6. A method for manufacturing a semiconductor device according to claim 4, wherein the semiconductor device is incorporated into an electronic device selected from to group consisting of: a personal computer, a video camera, a mobile computer, a goggle type display, a player using a record medium, a digital camera, cellular phone, portable book, and a display.

7. A method for manufacturing a semiconductor device according to claim 4, wherein the second semiconductor film comprises an inert gas element at a concentration of $1 \times 10^{19}/cm^3$ to $1 \times 10^{22}/cm^3$.

8. A method of manufacturing a semiconductor device comprising:
   forming a first semiconductor film over an insulating surface;
   forming a barrier film on the first semiconductor film;
   forming a second semiconductor film on the barrier film by sputtering, the second semiconductor film comprising an inert gas element at a concentration of $1 \times 10^{19}/cm^3$ to $1 \times 10^{22}/cm^3$;
   performing gettering of an impurity into the second semiconductor film to remove or reduce the impurity in the first semiconductor film;

removing the second semiconductor film;

patterning the first semiconductor film into at least one semiconductor layer; and forming a gate electrode over the first semiconductor layer with a gate insulating film interposed therebetween wherein an RF electric power density in the step of forming the second semiconductor film is 0.137 to 6.847 W/cm$^2$.

9. A method for manufacturing a semiconductor device according to claim 8, wherein the inert gas is at least one gas selected from the group consisting of He, Ne, Ar, Kr and Xe.

10. A method for manufacturing a semiconductor device according to claim 8, wherein the semiconductor device is incorporated into an electronic device selected from the group consisting of: a personal computer, a video camera, a mobile computer, a goggle type display, a player using a record medium, a digital camera, cellular phone, portable book, and a display.

11. A method of manufacturing a semiconductor device comprising:

forming a first semiconductor film over an insulating surface;

forming a barrier film on the first semiconductor film;

forming a second semiconductor film on the barrier film by sputtering, the second semiconductor film comprising an inert gas element at a concentration of $1 \times 10^{19}$/cm$^3$ to $1 \times 10^{22}$/cm$^3$;

performing gettering of an impurity into the second semiconductor film to remove or reduce the impurity in the first semiconductor film;

removing the second semiconductor film, patterning the first semiconductor film into at least one semiconductor layer; and forming a gate electrode over the first semiconductor layer with a gate insulating film interposed therebetween, wherein a compression stress in the second semiconductor film is with a range from $-10.0 \times 10^{10}$ dynes/cm$^2$ to $-5.0 \times 10^9$ dynes/cm$^2$, wherein a deposition pressure in the step of forming the second semiconductor film is 1.5 Pa or lower, and wherein an RF electric power density in the step of forming the second semiconductor film is 0.137 to 6.847 W/cm$^2$.

12. A method for manufacturing a semiconductor device according to claim 11, wherein the inert gas is at least one gas selected from the group consisting of He, Ne, Ar, Kr and Xe.

13. A method for manufacturing a semiconductor device according to claim 11, wherein the semiconductor device is incorporated into an electronic device selected from the group consisting of: a personal computer, a video camera, a mobile computer, a goggle type display, a player using a record medium, a digital camera, cellular phone, portable book, and a display.

14. A method of manufacturing a semiconductor device comprising:

forming a first semiconductor film over an insulating surface;

forming an oxide film on the first semiconductor film by oxidizing a surface of the first semiconductor film;

forming a second semiconductor film by sputtering on the barrier film, the second semiconductor film comprising an inert gas element at a concentration of $1 \times 10^{19/cm3}$ to $1 \times 10^{22}$/cm$^3$;

reducing an impurity contained in the first semiconductor film into the second semiconductor film by heat treatment; and removing the second semiconductor film wherein a deposition pressure in the step of forming the second semiconductor film is 1.5 Pa or lower, and wherein an RF electric power density in the step of forming the second semiconductor film is 0.137 to 6.847 W/cm$^2$.

15. A method for manufacturing a semiconductor device according to claim 14, wherein the semiconductor device is incorporated into an electronic device selected from the group consisting of: a personal computer, a video camera, a mobile computer, a goggle type display, a player using a record medium, a digital camera, cellular phone, portable book, and a display.

* * * * *